United States Patent
Cohen et al.

(10) Patent No.: US 6,784,485 B1
(45) Date of Patent: Aug. 31, 2004

(54) DIFFUSION BARRIER LAYER AND SEMICONDUCTOR DEVICE CONTAINING SAME

(75) Inventors: Stephan Alan Cohen, Wappingers Falls, NY (US); Timothy Joseph Dalton, Ridgefield, CT (US); John Anthony Fitzsimmons, Poughkeepsie, NY (US); Stephen McConnell Gates, Ossining, NY (US); Lynne M. Gignac, Beacon, NY (US); Paul Charles Jamison, Hopewell Junction, NY (US); Kang-Wook Lee, Yorktown Heights, NY (US); Sampath Purushothaman, Yorktown Heights, NY (US); Darryl D. Restaino, Modena, NY (US); Eva Simonyi, Bronx, NY (US); Horatio Seymour Wildman, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/502,729

(22) Filed: Feb. 11, 2000

(51) Int. Cl.[7] .............................................. H01L 29/792

(52) U.S. Cl. ...................... 257/325; 257/288; 257/296; 257/321; 257/374; 257/411; 257/501; 257/506; 257/508; 257/635; 257/639

(58) Field of Search ................................. 257/288, 296, 257/321, 325, 374, 411, 501, 506, 508, 635, 639, 40, 77, 324, 327, 350, 440, 507, 520, 524, 640–649, 410, 636

(56) References Cited

U.S. PATENT DOCUMENTS

| 235,456 A | * | 12/1880 | Bose ........................... 430/512 |
| 4,123,571 A | * | 10/1978 | Balog et al. ........... 427/249.15 |
| 5,521,127 A | | 5/1996 | Hori |
| 5,837,592 A | | 11/1998 | Chang et al. |
| 5,861,651 A | | 1/1999 | Brasen et al. |
| 5,939,763 A | * | 8/1999 | Hao et al. .................... 257/411 |
| 6,100,559 A | * | 8/2000 | Park ........................... 257/315 |
| 6,147,009 A | * | 11/2000 | Grill et al. .................. 438/780 |
| 6,228,761 B1 | * | 5/2001 | Ngo et al. ................... 438/637 |
| 6,436,824 B1 | * | 8/2002 | Chooi et al. ................ 438/687 |
| 2002/0020919 A1 | * | 2/2002 | Li et al. ...................... 257/759 |

FOREIGN PATENT DOCUMENTS

GB 2334818 1/1999

* cited by examiner

Primary Examiner—Long Pham
Assistant Examiner—Wai-Sing Louie
(74) Attorney, Agent, or Firm—Daniel P. Morris; Dilworth & Barrese LLP

(57) ABSTRACT

A semiconductor device containing a diffusion barrier layer is provided. The semiconductor device includes at least a semiconductor substrate containing conductive metal elements; and, a diffusion barrier layer applied to at least a portion of the substrate in contact with the conductive metal elements, the diffusion barrier layer having an upper surface and a lower surface and a central portion, and being formed from silicon, carbon, nitrogen and hydrogen with the nitrogen being non-uniformly distributed throughout the diffusion barrier layer. Thus, the nitrogen is more concentrated near the lower and upper surfaces of the diffusion barrier layer as compared to the central portion of the diffusion barrier layer. Methods for making the semiconductor devices are also provided.

15 Claims, 2 Drawing Sheets

DIFFUSION BARRIER LAYER AND SEMICONDUCTOR DEVICE CONTAINING SAME

TECHNICAL FIELD

A diffusion barrier layer and semiconductor device containing same are described herein. More particularly, a novel diffusion barrier layer formed from silicon, carbon, nitrogen and hydrogen with the nitrogen being more concentrated near the lower and upper surfaces of the diffusion barrier layer, i.e., non-uniformly distributed throughout, and semiconductor devices containing such layers are described herein. Also described is a method for manufacturing the semiconductor device containing the diffusion barrier layer.

DESCRIPTION OF THE RELATED ART

Generally, semiconductor devices include a plurality of circuits which form an integrated circuit. Integrated circuits can be useful for computers and electronic equipment and can contain millions of transistors and other circuit elements that can be fabricated on a single silicon crystal semiconductor device, i.e., chip. For the device to be functional, a complex network of signal paths will normally be routed to connect the circuit elements distributed on the surface of the device. Efficient routing of these signals across the device can become more difficult as the complexity and number of the integrated circuits are increased. Thus, the formation of multi-level or multi-layered interconnection schemes such as, for example, dual damascene wiring structures, have become more desirable due to their efficacy in providing high speed signal routing patterns between large numbers of transistors on a complex semiconductor chip.

When fabricating integrated circuit wiring with a multi-layered scheme, an insulating or dielectric material, such as silicon oxide, will normally be patterned with several thousand openings to create conductive line openings and/or via openings using photoprocessing techniques, e.g., photolithography with subsequent etching by a plasma process. These via openings are typically filled with a conductive metal material, e.g., aluminum, copper, etc., to interconnect the active and/or passive elements of the integrated circuits. The semiconductor device is then polished to level its surface.

A diffusion barrier layer formed from, e.g., silicon nitride with the nitrogen being uniformly distributed throughout the layer, is then normally deposited over the planarized surface featuring the dielectric material and conductive metal material. Next, a dielectric material is deposited over the diffusion barrier layer, via and conductive line openings are created within the dielectric and barrier layers as before, another conductive metal material is deposited within the openings and another diffusion barrier layer is deposited thereon. The process is then repeated to fabricate a multi-layer interconnect wiring system. The diffusion barrier layers act as an adhesive for keeping the successive layers of the interconnect structure together. However, several problems exist when employing a diffusion barrier layer formed from silicon and nitrogen, i.e., silicon nitride, where the nitrogen is uniformly distributed throughout. Firstly, the diffusion barrier layer does not provide optimum adhesion thereby causing the risk of delamination in the semiconductor device during fabrication or service. Secondly, this type of diffusion barrier layer also causes the semiconductor device to possess a relatively high dielectric constant, typically between 6 and 7, thereby resulting in a higher capacitance between the conductive metal material causing the electric signals to travel at a slower speed with increased cross-talk through the interconnection wiring patterns.

It would be desirable to provide a semiconductor device containing a diffusion barrier layer that can provide a robust adhesion between the interconnection layers while also maintaining a relatively low dielectric constant for the device thereby allowing the electric signals to travel faster therethrough.

SUMMARY

A novel diffusion barrier layer has been discovered. The novel diffusion barrier layer for use in semiconductor devices has an upper surface, a lower surface and a central portion and includes silicon, carbon, nitrogen and hydrogen with the nitrogen being non-uniformly distributed throughout the diffusion barrier layer, i.e., more concentrated near the lower and upper surfaces of the barrier layer as compared to the central portion of the diffusion barrier layer. Thus, the novel layer may be described as a trilayer with the middle layer comprised primarily of silicon, carbon and hydrogen and the upper and lower layers being comprised of nitrogen, silicon, carbon, hydrogen and, optionally, oxygen.

A semiconductor device containing the diffusion barrier layer includes a substrate containing a first set of conductive metal elements, a first diffusion barrier layer applied to at least a portion of the substrate in contact with the conductive metal elements, the diffusion barrier layer having an upper surface, a lower surface and a central portion and being formed from silicon, carbon, nitrogen and hydrogen with the nitrogen being non-uniformly distributed throughout. Thus, for example, the nitrogen is concentrated near the lower and upper surfaces of the diffusion barrier layer as compared to the central portion of the diffusion barrier layer. The semiconductor device may also include a dielectric layer applied on the first diffusion barrier layer, line and via openings formed through both the dielectric layer and first diffusion barrier layer to expose the surface of at least one of the conductive metal elements so that a conductive metal material deposited within and filling the line and via openings provides a second set of electrical contact conductive metal elements. Optionally, a second diffusion barrier layer is applied in contact with at least a portion of the top surface of the second set of conductive metal elements, the diffusion barrier layer having an upper surface, a lower surface and a central portion and being formed from silicon, carbon, nitrogen and hydrogen with the nitrogen being non-uniformly distributed throughout.

A method for making the semiconductor device has also been discovered which includes the steps of:

a) forming a first diffusion barrier layer on a semiconductor substrate containing a first set of conductive metal elements, the diffusion barrier layer having an upper surface, a lower surface and a central portion and comprising silicon, carbon, nitrogen and hydrogen and being deposited such that the nitrogen is non-uniformly distributed throughout;

b) forming a dielectric layer on at least a portion of the first diffusion barrier layer;

c) forming line and via openings in the dielectric layer and diffusion barrier layer to expose the top surface of at least one of the conductive metal elements in the first set thereof;

d) depositing a conductive metal material within and filling the line and via openings to form a second set of conductive metal elements; and, e) forming a second diffusion barrier layer over the top surfaces of the second set of conductive metal elements, the diffusion barrier layer having an upper surface, a lower surface and a central portion and comprising silicon, carbon, nitrogen and hydrogen with the nitrogen being non-uniformly distributed throughout.

The semiconductor device described herein containing a diffusion barrier layer formed from silicon, carbon, nitrogen and hydrogen with the nitrogen being non-uniformly distributed throughout the diffusion barrier layer advantageously possesses a low dielectric constant thereby causing the electric signals generated by the device to travel at a faster rate with reduced cross-talk while the diffusion barrier layer acts as an adhesive such that the semiconductor device is held together more robustly for an extended period of time.

BRIEF DESCRIPTION OF THE DRAWINGS

Preferred embodiments of the invention are described below with reference to the drawings, which are described as follows.

DESCRIPTION OF THE PREFERRED EMBODIMENTS

A semiconductor device in accordance with this disclosure includes a semiconductor substrate including, for example, a fist dielectric layer and a first set of conductive metal elements, and a first diffusion barrier layer applied on at least a portion of the substrate in contact with at least a portion of the conductive metal elements. The semiconductor device may also include a second dielectric layer applied on the diffusion barrier layer, line and via openings formed within both the second dielectric layer and first diffusion barrier layer and exposing the surface of at least one of the conductive metal elements therein, a conductive metal material deposited within and filling the openings to form a second set of conductive metal elements, and, a second diffusion barrier layer applied on the top surface thereof.

Figure 1A:
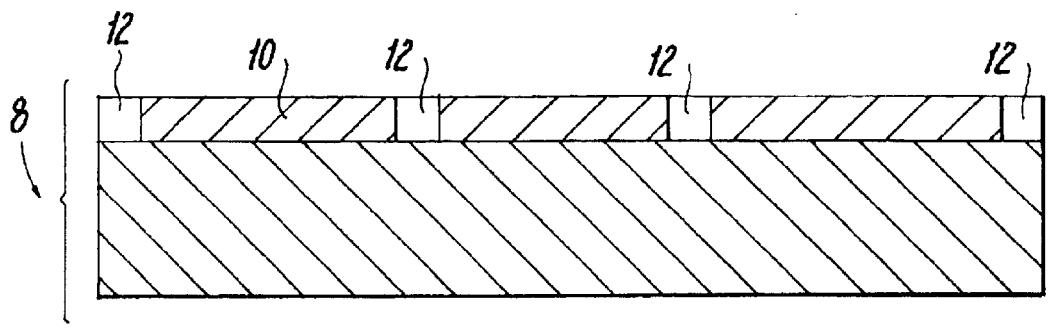
FIG. 1A is a schematic cross-sectional view of a semiconductor substrate containing a first set of conductive metal elements.
Figure 1B:
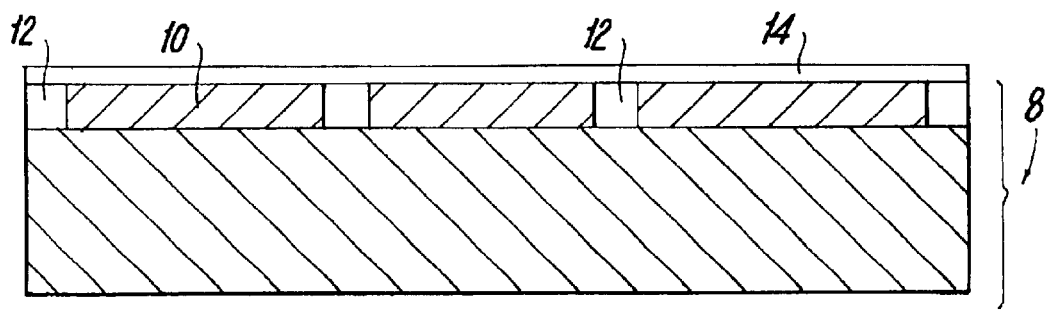
FIG. 1B is a schematic cross-sectional view of the semiconductor substrate of FIG. 1A with a first diffusion barrier layer formed on a portion of the substrate in contact with the conductive metal elements.

As seen in the embodiments shown in FIGS. 1A–1F, the semiconductor device described herein can be formed by first providing a semiconductor substrate 8 that is of the conventional type and may contain, for example, circuitry and other interconnection levels. Generally, the semiconductor substrate 8 will have a dielectric layer 10 with conductive metal material being deposited in and filling line openings to provide a first set of conductive metal elements 12. Suitable materials for dielectric layer 10 and conductive metal elements 12 can include any conventional dielectric and conductive metal material known to one skilled in the art. Preferred materials include, but are not limited to, fluorinated $SiO_2$, $SiO_2$, organic thermoset or thermoplastic dielectrics such as polyimides, polyarylenes ethers, benzocyclobutenes and the like, spin on glasses with or without porosity such as hydrogen silsesquioxane, methyl silsesquioxane, tetraethyl orthosilicate based spin on films and the like, amorphous alloys of Si, O, C and H, amorphous alloys of Si, O, F and H and the like for dielectric layer 10 with the organic dielectrics being preferred for use herein and Ti, TiN, TiW, Ta, TaN, W, Al, Pd, Cu and the like and combinations thereof for conductive metal elements 12 with Cu being the preferred material for use herein. Techniques for forming dielectric layer 12 and conductive metal elements 12 on substrate 8 (e.g., chemical vapor deposition, physical vapor deposition, spin coating and curing, and electroplating) are within the purview of one skilled in the art. The dielectric layer 10 and conductive metal elements 12 formed therein can then be subjected to a planarization process such as, for example, a standard CMP polishing process known to one skilled in the art to advantageously provide a substantially planar surface as generally depicted in FIG. 1A.

Following the formation of dielectric layer 10 and conductive metal elements 12, a first diffusion barrier layer 14 having an upper surface 14a, lower surface 14b and central portion 14c formed from silicon, carbon, nitrogen and hydrogen with nitrogen being non-uniformly distributed throughout is applied to at least a portion of the substrate in contact with at least a portion of conductive metal elements 12. Thus, the nitrogen is relatively more concentrated near upper and lower surfaces 14a and 14b as compared to central portion 14c. In general, diffusion barrier layer 14 is formed by subjecting semiconductor substrate 8 to plasma enhanced chemical vapor deposition (PECVD) employing any conventional PECVD reactor or chamber. Alternatively, diffusion barrier layer 14 may be formed by atomic layer deposition. When employing PE CVD, the interior walls of the reactor or chamber are coated with a film of, for example, silicon nitride. By coating the walls of the reactor with silicon nitride greater adhesion of the barrier layer 14 to the top surfaces of the substrate, e.g., dielectric layer 10 and conductive metal elements 12, can be achieved.

Next, the semiconductor substrate 8 is placed in the PECVD reactor. Typically, the exposed top surface of the conductive metal elements 12, e.g., Cu, will contain contaminants such, for example, oxides of Cu (due to air oxidation of the Cu), which can lead to inferior adhesion of the diffusion barrier layer to the conductive metal elements 12. Thus, it is preferable to remove substantially all of the contaminants. Accordingly, substrate 8 is subjected to a plasma cleaning by injecting a gas flow of, e.g., pure $NH_3$, or a gas mixture containing a nitrogen-containing gas such as, e.g., $NH_3$, with optional other gases into the reactor to form a plasma which advantageously removes the contaminants. Alternatively a gas mixture containing $H_2$ may be used for plasma cleaning.

It is particularly advantageous to employ a nitrogen-containing gas mixture because during the plasma cleaning a thin film containing nitrogen is formed on the top surfaces of dielectric layer 10 and conductive metal elements 12, e.g., Cu, which is lower surface 14b of the resulting diffusion barrier layer, and it has been found that this film reacts with the Cu thereby providing greater adhesion of the film to the conductive metal elements 12. It has also been found that this thin film containing nitrogen also renders the top surface of the Cu elements resistant to oxidation by air. Generally, when applying this film, the nitrogen-containing film will have (1) a nitrogen content of about 1–20 atomic % N and preferably about 5 atomic % and (2) a nitrogen:carbon ratio of less than about 0.2 and will range from about 0.1 to about 0.5. It is to be understood that small amounts of oxygen, e.g., in an amount less than about 5 atomic % and preferably less than about 2 atomic %, may optionally be present in the film due to, e.g., air exposure or another source of oxygen. The thickness of the nitrogen-containing film will ordinarily range from about 1 nm to about 10 nm and preferably from about 2 nm to about 4 nm. A thin film is required herein since the greater the thickness of the film the greater amount of nitrogen will be present in the film which will result in a higher dielectric constant of the semiconductor device. The temperature and power employed during this step can range from about 200° C. to about 500° C. at a power of from about 100 watts to about 1,000 watts. The time period for removing the contaminants and forming the film will generally not exceed about 120 seconds.

Following the removal of the contaminants and formation of the foregoing nitrogen-containing film, a gas mixture of, for example, an organosilane containing silicon, carbon and hydrogen, and an inert gas is injected into the PECVD reactor to form a silicon/carbon/hydrogen-containing film on the top surface of the thin nitrogen-containing film, i.e., central portion 14c of the resulting diffusion barrier layer. Useful organosilane gas mixtures include methylsilane, dimethylsilane, trimethylsilane, tetramethylsilane and the like. Alternatively, mixtures of silane and a hydrocarbon gas, e.g., methane, ethylene, acetylene, etc., can also be used. Suitable inert gases for use herein include argon, helium and the like with helium being preferred.

The thickness of the silicon/carbon/hydrogen-containing film will ordinarily range from about 5 nm to about 100 nm and preferably from about 20 nm to about 60 nm. In general, the temperature employed can range from about 200° C. to about 500° C. with a power of from about 100 watts to about 1,000 watts with about 500 watts being preferred. The time period for forming the film can range from about 10 to about 30 seconds.

Next, the silicon/carbon/hydrogen-containing film is subjected to a plasma treatment to render the film more dense and less permeable to gases thereby allowing the nitrogen employed in the following plasma step described below to remain at the upper surface of the silicon/carbon/hydrogen-containing film. It is advantageous for the nitrogen to remain at the upper surface and not to penetrate into the silicon/carbon/hydrogen-containing film in order to preserve the low dielectric constant of the silicon/carbon/hydrogen-containing film. Also this nitrogen-containing upper surface results in a strong adhesion of the dielectric layer 16 onto the diffusion barrier film 14 which is described below. The plasma employed can be any suitable gas, e.g., helium, and is typically injected into the reactor for a time period of from about 10 to about 60 seconds with the power ranging from about 100 watts to about 500 watts.

Following the plasma treatment, a second nitrogen-containing gas plasma is injected into the reactor to form a second nitrogen-containing film, i.e., upper surface 14a of the resulting diffusion barrier layer, thereby completing the formation of the first diffusion barrier layer 14. Suitable nitrogen-containing gases include, for example, $NH_3$, a mixture of $NH_3$ and $N_2$ and the like. Generally, when applying this film, the nitrogen-containing film will have (1) a nitrogen content of about 1–20 atomic % N and preferably about 5 atomic % N and (2) a nitrogen:carbon ratio in the range of from about 0.1 to about 0.5, preferably less than about 0.2. It is to be understood that the nitrogen-containing film may optionally include small amounts of oxygen, usually in an amount less than about 5 atomic % and preferably less than about 2 atomic %, due to, e.g., air exposure or another source of oxygen. The nitrogen-containing film will ordinarily have a thickness ranging from about 1 nm to about 10 nm and preferably from about 2 nm to about 5 nm. Parameters for forming the second nitrogen-containing film (e.g., temperature, time, power, etc.) can range from about 200° C. to about 500° C. for the temperature, from about 5 to about 100 seconds for the time and from about 50 watts to about 500 watts for the power. Optionally, the completed diffusion barrier layer 14 can contain, e.g., from about 1 to about 5 atomic % oxygen, due to air exposure or another source of oxygen It is also contemplated that alternative methods for depositing the diffusion barrier layer of this invention can be employed herein. For example, the diffusion barrier layer can be deposited employing pulsed CVD or atomic layer deposition methods whereby very thin layers of each film deposited in forming the diffusion barrier layer are produced with a high degree of composition control such that the desired nitrogen distribution is achieved in the diffusion barrier layer.

Figure 1C:
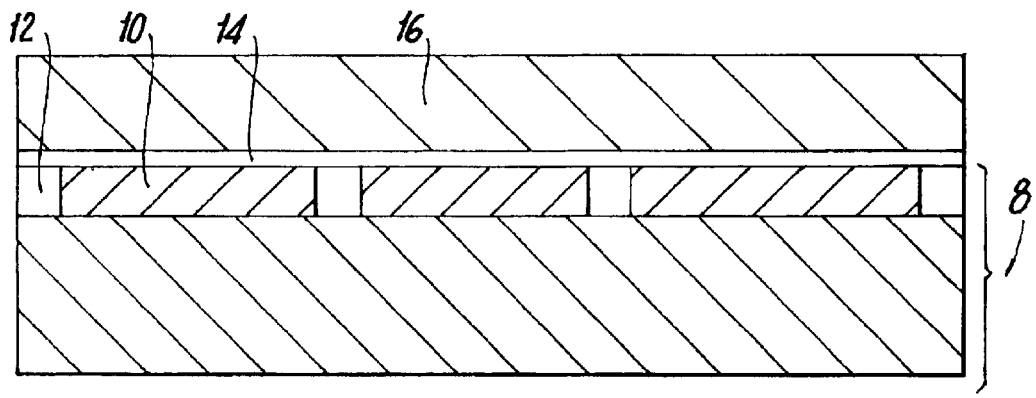
FIG. 1C is a schematic cross-sectional view of the semiconductor substrate of FIG. 1B with a dielectric layer formed on the first diffusion barrier layer.
Figure 1D:
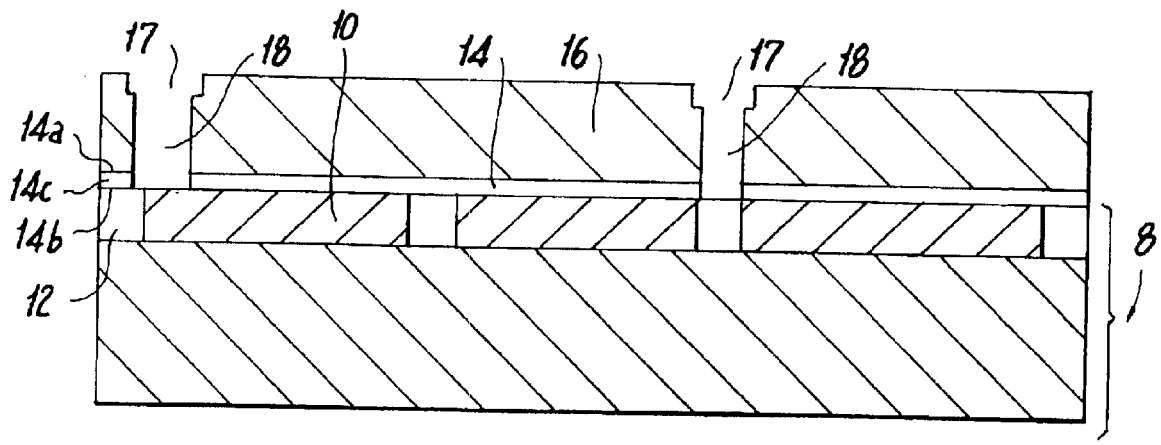
FIG. 1D is a schematic cross-sectional view of the semiconductor substrate of FIG. 1C with etched line and via openings.

Once the first diffusion barrier layer 14 has been formed, dielectric layer 16 can be applied onto the surface of the diffusion barrier layer 14 (See FIG. 1C). However, prior to forming dielectric layer 16 it is particularly advantageous to optionally treat the surface of diffusion barrier layer 14 with an adhesion promoter. Suitable adhesion promoters for use herein can be any conventional adhesion promoter known to one skilled in the art. Preferred adhesion promoters include organosilanes such as, e.g., γ-amino propylsilane and the like. Techniques for treating the surface of the barrier layer 14 with an adhesion promoter are within the purview of one skilled in the art, for example, by employing a spin coater. The dielectric material used herein to form dielectric layer 16 can be any suitable dielectric known to one skilled in the art. Preferred dielectric materials for use herein include, but are not limited to, fluorinated $SiO_2$, $SiO_2$, organic thermoset or thermoplastic dielectrics such as, for example, polyimides, polyarylene ethers, benzocyclobutenes and the like, spin on glasses with or without porosity such as hydrogen silsesquioxane, methyl silsesquioxane, tetraethyl orthosilicate based spin on films and the like, amorphous alloys of Si, O, C and H, amorphous alloys of Si, O, F and H and the like with the organic dielectrics being preferred for use herein.

The dielectric layer 16 can ordinarily be applied on the surface of barrier layer 14 as a substantially planarized layer. A substantially planarized layer can be achieved either directly through the formation process, e.g., in the case of spin on film, or by applying known and conventional procedures, e.g., chemical-mechanical polishing (CMP), once the dielectric layer 16 has been formed. The dielectric layer will ordinarily have a thickness that will range from about 200 nm to about 1,000 nm and preferably from about 300 nm to about 700 nm. Techniques for forming the dielectric layer 16 are within the purview of one skilled in the art.

Once the dielectric layer 16 has been formed on the surface of diffusion barrier layer 14, line openings 17 and via openings 18 are then created within dielectric layer 16 and barrier layer 14 to expose the top surface of at least one of the conductive metal elements 12. (See FIG. 1D). It is particularly advantageous to create line and via openings that are of a mono or dual damascene (via plus next level conductor) wiring structure for use herein. Line and via openings such as the dual damascene structure can be formed in dielectric layer 16 and barrier layer 14 by techniques known to those skilled in the art. For example, a resist layer (not shown) can be applied to the top surface of the dielectric layer 16. The resist layer is patterned and developed using known photolithographic techniques. Then etching(s) is conducted to form openings 17 and 18, such as, by employing a suitable anisotropic etching technique, e.g., reactive ion etching (RIE). Parameters for creating openings 17 and 18 (e.g., type of etchant(s), concentration of etchant(s), time, temperature, etc.) are within the purview of one skilled in the art. The desired dimensions of each opening 17 and 18 will normally vary according to the current-carrying requirements for a given conductor.

Figure 1E:
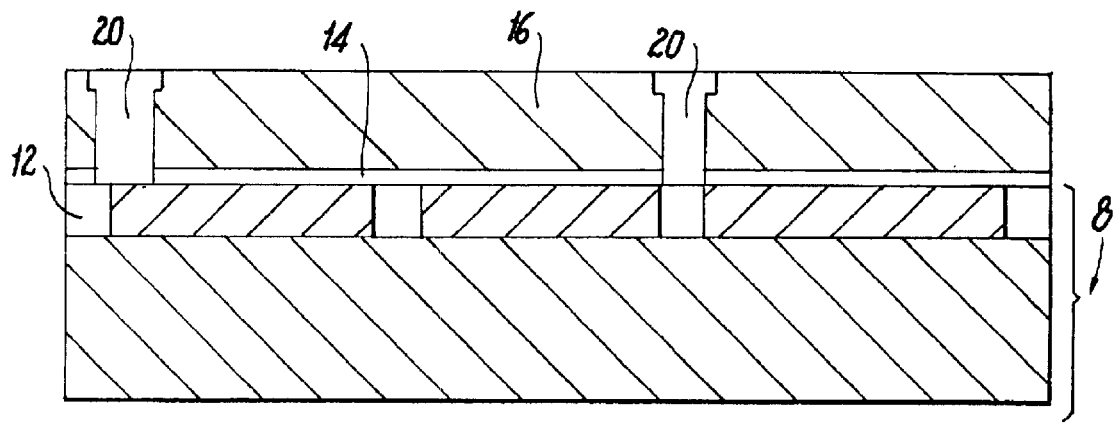
FIG. 1E is a schematic cross-sectional view of the semiconductor substrate of FIG. 1D with a conductive metal material deposited in the etched openings to form a second set of conductive metal elements; and, FIG. 1F is a schematic cross-sectional view of the semiconductor substrate of FIG. 1E with a second diffusion barrier layer formed on the top surfaces of the dielectric layer and second set of conductive metal elements.

Following the formation of openings 17 and 18, a conductive metal material is deposited within and fills each opening 17 and 18 to form a second set of conductive metal elements 20 as shown in FIG. 1E. The second set of conductive metal elements 20 can be formed by any known or conventional procedure, for example, by electroplating or selective or non-selective chemical vapor depositions (CVD's), sputtering or other physical vapor deposition. Any conventional conductive metal material can be used herein. Suitable metal materials for forming conductive metal elements 20 include, but are not limited to, Ti, TiN, TiW, Ta, TaN, W, Al, Cu, Pd and the like and combinations thereof with Cu being preferred for use herein.

Figure 1F:
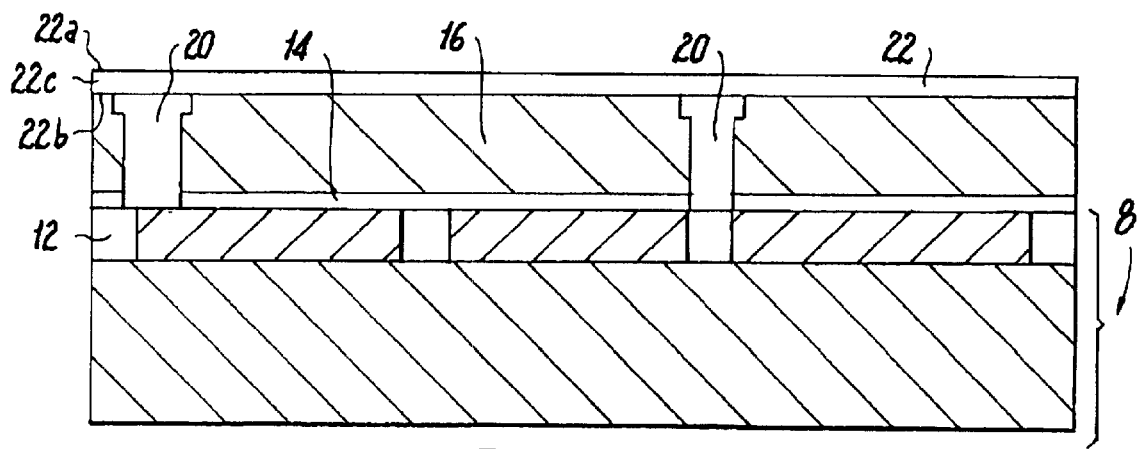

A second diffusion barrier layer 22 having upper surface 22a, lower surface 22b and central portion 22c is then formed on the top surfaces of dielectric layer 16 and conductive metal elements 20 (See FIG. 1F). Techniques and parameters (e.g., time, temperature, power, etc.) for forming diffusion barrier layer 22 has been described hereinabove with respect to first diffusion barrier layer 14 and can be used to form diffusion barrier layer 22. Thicknesses for each of the above described films applied in forming diffusion barrier layer 14 will generally be the same as those used in forming diffusion barrier layer 22.

If desired, additional layers (not shown) can be applied to diffusion barrier layer 22. For example, a dielectric layer can first be applied to diffusion barrier layer 22 with line and via openings being created within the dielectric layer and barrier layer 22 to expose at least a portion of the top surface of conductive metal elements 20. A conductive metal material, e.g., Cu, can be deposited within and fills each opening to form a third set of conductive metal elements. Next, a third diffusion barrier layer as discussed hereinabove can be formed thereon.

The following example as compared to the comparative examples are illustrative of the present invention.

EXAMPLE 1

The following example is given to illustrate the adhesion of a diffusion barrier layer within the scope of this invention to a conductive metal material. The method employed in this example has also been used to deposit each of the three films in forming the completed diffusion barrier layer of this invention in integrated circuit test sites having three patterned metal layers according to the general description given above.

The semiconductor substrate used in this example consisted of an unpatterned copper film deposited on a silicon wafer substrate of 200 mm diameter with a suitable combination of adhesion layers deposited between the copper film and the silicon substrate. Examples of suitable adhesion layers are silicon nitride or silicon oxide on the silicon wafer and an adhesive metal such as Ti, Ta or Cr. Thus, the substrate is described as a Cu/adhesive metal/silicon nitride/silicon wafer. The copper film was then polished by CMP to produce a substantially planarized copper surface. Next, a plasma enhanced chemical vapor deposition (PE CVD) reactor model DxZ made by Applied Materials was used to deposit the diffusion barrier layer. Prior to forming the diffusion barrier layer, the interior walls of the PE CVD reactor were coated with a film composed of silicon, nitrogen and hydrogen (a silicon nitride coating).

The test substrate containing the un-patterned copper film was positioned on a heater block in the reactor at a temperature of 350° C. The oxide of copper and other contamination was removed from the copper surfaces as follows: a gas flow of pure $NH_3$ was admitted to the reactor at a pressure of 4.5 torr and a plasma was formed using 325 watts of RF power for 45 seconds. The substrate temperature reached approximately 350° C. with a first nitrogen-containing film of about 2 to about 4 nm thick being deposited on the substrate during this time. Next, a gas mixture composed of trimethylsilane gas and helium was admitted to the reactor at a pressure of 8.7 torr and a plasma was formed for 30 seconds to deposit a silicon, carbon and hydrogen film at a thickness of 55 nm. A helium plasma step was then used to render the silicon/carbon/hydrogen film more dense and less permeable to gases by flowing He in the reactor at a pressure of 8.7 torr and applying of 250 watts of RF power for 40 seconds. $NH_3$ was then added to this plasma for 10 seconds while leaving other conditions constant. The separate plasma step using the mixture of $NH_3$ and He formed a thin second nitrogen-containing film by adding nitrogen to the top 3 nm of the silicon/carbon/hydrogen film to form the diffusion barrier layer. The thicknesses of the first and second nitrogen-containing films were measured by Transmission Electron Microscopy (TEM) and the compositions of each film were measured by an Auger Electron Spectroscopy (AES) depth profile.

The diffusion barrier layer of this example was further characterized by X-ray photoelectron spectroscopy (XPS) to obtain both atomic concentrations (excluding hydrogen atoms) and to obtain chemical bonding information. The barrier layer deposited and treated as described above was analyzed with XPS. The atomic concentrations in the upper surface of the layer of Si, C, O, and N were 30%, 56%, 10% and 3.3%, respectively, with around 80% of the Si atoms exhibiting chemical bonding characteristic of silicon carbide and silicon nitride. The remaining Si exhibited bonding characteristic of silicon oxide. Approximately 45% of the C atoms exhibited chemical bonding characteristic of silicon carbide and 55% exhibited bonding similar to organic compounds (including, e.g., methyl carbon). These results demonstrated that the diffusion barrier layer contained silicon carbon, nitrogen and oxygen in various bonding states and that the carbon is predominantly silicon carbide and organic in nature with the barrier layer containing a very small amount of silicon nitride.

A Peel Test was then performed on the test substrate both before and after subjecting the test substrate to 6 thermal stress cycles to 400° C. for 45 minutes. The Peel Test was performed by coating the test vehicle with Polyimide (20 microns thick), cutting the substrate into rectangular strips (about 100×0.5 cm), and subjecting each strip to a calibrated Peel Force. A Peel Strength of 70 g/mm was measured before thermal stress and 69 g/mm after thermal stress with this Peel Strength being completely uniform on the entire copper wafer surface (100% of area showed strong adhesion).

COMPARATIVE EXAMPLE 1

The following comparative example is given to illustrate poor adhesion of a diffusion barrier layer outside the scope of this invention to a conductive metal material.

The semiconductor substrate of Example 1 consisting of an unpatterned copper film deposited on a silicon wafer substrate of 200 nm diameter with a suitable combination of adhesion layers deposited between the copper film and the silicon substrate with the copper film being polished by CMP to produce a substantially planarized copper surface was employed in this example. Examples of suitable adhesion layers are silicon nitride or silicon oxide on the silicon wafer and an adhesive metal such as Ti, Ta or Cr. Thus, the substrate is described as a Cu/adhesive metal/silicon nitride/silicon wafer. The PE CVD reactor used in Example 1 was also used in this example. First, prior to forming the diffusion barrier layer, the interior walls of the PE CVD reactor were coated with a film composed of silicon, oxygen and hydrogen (a silicon oxide coating).

The substrate containing the un-patterned copper film was positioned on a heater block in the reactor at a temperature of 350° C. Next, the oxide of copper and other contamination was removed from the copper surfaces as follows: a gas flow of pure $NH_3$ was admitted to the reactor at a pressure of 4.5 torr and a plasma was formed using 325 watts of RF power for 15 seconds. The substrate temperature reached approximately 350° C. and during this time of 15 seconds a thin interfacial layer was deposited on the copper film which had a substantial oxygen content thereby producing poor adhesion to the copper surface. Next, a gas mixture composed of timethylsilane gas and He was admitted to the reactor at a pressure of 8.7 torr and a plasma was formed for 30 seconds to deposit a silicon/carbon/hydrogen film at a thickness of 55 nm. A He plasma step was used to render the film more dense and less permeable to gases by flowing He in the reactor at a pressure of 8.7 torr and applying 250 watts of RF power for 20 seconds thereby forming the diffusion barrier layer.

The Peel Test of Example 1 was then performed on the test substrate both before and after subjecting the test substrate to 6 thermal stress cycles to 400° C. for 45 minutes. A Peel Strength ranging from 0 to 40 g/mm was measured before thermal stress and 0 g/mm after thermal stress. The Peel Strength was non-uniform on the copper wafer surface with about 60% of the area showing 0 g/mm (spontaneous delamination) and 40% of the area showing 40 g/mm.

COMPARATIVE EXAMPLE 2

The following comparative example is given to illustrate poor adhesion of a diffusion barrier layer outside the scope of this invention to a conductive metal material.

The semiconductor substrate of Example 1 consisting of an unpatterned copper film deposited on a silicon wafer substrate of 200 nm diameter with a suitable combination of adhesion layers deposited between the copper film and the silicon substrate with the copper film being polished by CMP to produce a substantially planarized copper surface was employed in this example. Examples of suitable adhesion layers are silicon nitride or silicon oxide on the silicon wafer and an adhesive metal such as Ti, Ta or Cr. Thus, the substrate is described as a Cu/adhesive metal/silicon nitride/silicon wafer. The PE CVD reactor used in Example 1 was also used in this example. First, prior to forming the diffusion barrier layer, the interior walls of the PE CVD reactor were coated with a film composed of Si, C and H (a SiCH coating) by is depositing trimethylsilane and He as the reactive gas.

The test substrate containing the un-patterned copper film was positioned on a heater block in the reactor at a temperature of 350° C. Next, the oxide of copper and other contamination was removed from the copper surfaces as follows: a gas flow of pure $NH_3$ was admitted to the reactor at a pressure of 4.5 torr and a plasma was formed using 325 watts of RF power for 15 seconds with the substrate temperature reaching approximately 350° C. A thin interfacial layer containing substantial carbon content was deposited on the copper film thereby producing poor adhesion to the copper surface. A gas mixture composed of trimethylsilane gas and He was admitted to the reactor at a pressure of 8.7 torr with a plasma being formed for 30 seconds to deposit a silicon/carbon/hydrogen film at a thickness of 55 nm. A He plasma step was used to render the film more dense and less permeable to gases by flowing He in the reactor at a pressure of 8.7 torr and applying 250 watts of RF power for 20 seconds thereby forming the diffusion barrier layer.

The Peel Test of Example 1 was then performed on the test substrate both before and after subjecting the test substrate to 6 thermal stress cycles to 400° C. for 45 minutes. A Peel Strength ranging from 0 to 5 g/mm was measured before thermal stress and 0 g/mm after thermal stress. The Peel Strength was non-uniform on the copper wafer surface with about 90% of the area showing 0 g/mm spontaneous delamination and 10% of the area showing from 2 to 5 g/mm.

Although the invention has been described in its preferred form with a certain degree of particularity, obviously many changes and variations are possible therein and will be apparent to those skilled in the art after reading the foregoing description. It is therefore to be understood that the present invention may be presented otherwise than as specifically described herein without departing from the spirit and scope thereof.

What is claimed is:

1. A diffusion barrier layer for semiconductor devices, the diffusion barrier layer having an upper surface, a lower surface and a central portion, the diffusion barrier layer comprising:

silicon, carbon, nitrogen and hydrogen, with the nitrogen possessing a low dielectric constant being non-uniformly distributed throughout the diffusion barrier layer, wherein the nitrogen is more concentrated near the lower and upper surfaces and the central portion is substantially devoid of nitrogen, the diffusion barrier layer being between about 7 nm and about 120 nm in thickness.

2. The diffusion barrier layer of claim 1 wherein the upper surface of the diffusion barrier layer is a layer which is relatively thin compared to the central portion of the diffusion barrier layer.

3. The diffusion barrier layer of claim 1 wherein the lower surface of the diffusion barrier layer is a layer which is relatively thin compared to the central portion of the diffusion barrier layer.

4. The diffusion barrier layer of claim 1 wherein the nitrogen is more concentrated near the lower and upper surfaces of the diffusion barrier layer compared to the central portion of the diffusion barrier layer.

5. The diffusion barrier layer of claim 1 further comprising oxygen.

6. The diffusion barrier layer of claim 1 wherein a portion of the carbon and the silicon in the layer is in the form of silicon carbide.

7. A semiconductor device comprising:

a substrate containing conductive elements; and a diffusion barrier layer applied to at least a portion of the substrate in contact with the conductive metal elements, the diffusion barrier layer being between about 7 nm and about 120 nm in thickness and having an upper surface, a lower surface and a central portion, the diffusion barrier layer comprising silicon, carbon, nitrogen and hydrogen, with the nitrogen possessing a low dielectric constant being non-uniformly distributed throughout the diffusion barrier layer, wherein the nitrogen is more concentrated near the lower and upper surfaces and the central portion is substantially devoid of nitrogen.

8. The diffusion barrier layer of claim 7 wherein the upper surface of the diffusion barrier layer is a layer which is relatively thin compared to the central portion of the diffusion barrier layer.

9. The diffusion barrier layer of claim 7 wherein the lower surface of the diffusion barrier layer is a layer which is relatively thin compared to the central portion of the diffusion barrier layer.

10. The semiconductor substrate of claim 7 wherein the nitrogen is more concentrated near the lower and upper surfaces of the diffusion barrier layer as compared to the central portion of the diffusion barrier layer.

11. The semiconductor device of claim 7 wherein the nitrogen is distributed only in the upper surface of the diffusion barrier layer.

12. The semiconductor device of claim 7 wherein the conductive elements are made from a metal selected from the group consisting of Ti, TiN, TiW, Ta, TaN, W, Al, Pd, Cu and combinations thereof.

13. The semiconductor device of claim 7 wherein the conductive elements are made from Cu.

14. The semiconductor device of claim 7 wherein the thickness of the diffusion barrier layer is from about 24 nm to about 68 nm.

15. The semiconductor device of claim 7 wherein a portion of the carbon and the silicon in the layer is in the form of silicon carbide.

* * * * *

UNITED STATES PATENT AND TRADEMARK OFFICE
CERTIFICATE OF CORRECTION

PATENT NO.    : 6,784,485 B1
DATED         : August 31, 2004
INVENTOR(S)   : Cohen et al.

It is certified that error appears in the above-identified patent and that said Letters Patent is hereby corrected as shown below:

Column 3,
Line 51, "fist" should be -- first --.

Signed and Sealed this

Nineteenth Day of April, 2005

JON W. DUDAS
*Director of the United States Patent and Trademark Office*